United States Patent
Tai et al.

(10) Patent No.: US 9,972,236 B2
(45) Date of Patent: May 15, 2018

(54) CIRCUIT FOR DRIVING DATA LINES OF DISPLAY DEVICE

(71) Applicant: NATIONAL CHIAO TUNG UNIVERSITY, Hsinchu (TW)

(72) Inventors: Ya-Hsiang Tai, Miaoli County (TW); Zong-Hua Cai, Taoyuan (TW); Ching-Chih Lin, Taichung (TW)

(73) Assignee: National Chiao Tung University, Hsinchu (TW)

( * ) Notice: Subject to any disclaimer, the term of this patent is extended or adjusted under 35 U.S.C. 154(b) by 18 days.

(21) Appl. No.: 15/167,454

(22) Filed: May 27, 2016

(65) Prior Publication Data

US 2017/0116906 A1 Apr. 27, 2017

(30) Foreign Application Priority Data

Oct. 27, 2015 (TW) .............................. 104135203 A

(51) Int. Cl.
*G09G 3/36* (2006.01)
*G09G 3/20* (2006.01)
(Continued)

(52) U.S. Cl.
CPC ......... *G09G 3/2014* (2013.01); *G09G 3/2018* (2013.01); *G09G 3/3614* (2013.01);
(Continued)

(58) Field of Classification Search
CPC ....... H03M 9/00; G09G 5/395; G09G 3/3696; G09G 3/3614; G09G 3/2018; G09G 3/3688; G09G 3/2014; G09G 2310/0289; G09G 2310/0286; G09G 2310/027; G09G 2300/0408; G09G 2310/0248; G09G 2330/028
See application file for complete search history.

(56) References Cited

U.S. PATENT DOCUMENTS

2003/0156104 A1* 8/2003 Morita ................. G09G 3/2011
345/204
2007/0211011 A1* 9/2007 Lee ...................... G09G 3/2081
345/100
(Continued)

FOREIGN PATENT DOCUMENTS

JP H11129545 A 5/1995
JP 2007293369 A 11/2007
(Continued)

*Primary Examiner* — Kwang-Su Yang
(74) *Attorney, Agent, or Firm* — McNees Wallace & Nurick LLC

(57) ABSTRACT

A data line driving circuit for a display device having a plurality of data lines is provided to include a plurality of data line drivers respectively coupled to the data lines. Each data line driver includes a register unit to store video data having a pixel value, a pulse width modulation unit generating a PWM signal having a pulse width positively correlated with the pixel value, and a charge-discharge unit performing charge-discharge operation to generate a data voltage on a respective one of the data lines according to the PWM signal. A magnitude of voltage variation on the respective data line is positively correlated with the pulse width of the PWM signal during the charge-discharge operation.

10 Claims, 20 Drawing Sheets

(51) Int. Cl.
*G09G 5/395* (2006.01)
*H03M 9/00* (2006.01)

(52) U.S. Cl.
CPC ......... *G09G 3/3688* (2013.01); *G09G 3/3696* (2013.01); *G09G 5/395* (2013.01); *H03M 9/00* (2013.01); *G09G 2300/0408* (2013.01); *G09G 2310/027* (2013.01); *G09G 2310/0248* (2013.01); *G09G 2310/0286* (2013.01); *G09G 2310/0289* (2013.01); *G09G 2330/028* (2013.01)

(56) References Cited

U.S. PATENT DOCUMENTS

| | | | | |
|---|---|---|---|---|
| 2009/0189882 A1* | 7/2009 | Huang | ................ | G09G 3/3688 345/211 |
| 2014/0078196 A1* | 3/2014 | Kumada | .............. | G09G 3/3648 345/691 |
| 2014/0307189 A1* | 10/2014 | Yim | ................ | G02F 1/133345 349/33 |

FOREIGN PATENT DOCUMENTS

| | | |
|---|---|---|
| JP | 2011033906 A | 2/2011 |
| TW | 2007293369 | 1/2007 |
| TW | 200933580 A | 8/2009 |

\* cited by examiner

CIRCUIT FOR DRIVING DATA LINES OF DISPLAY DEVICE

CROSS-REFERENCE TO RELATED APPLICATION

This application claims priority of Taiwanese Application No. 104135203, filed on Oct. 27, 2015.

FIELD

The disclosure relates to a driving circuit, and more particularly to a data line driving circuit, a data line driver and a display device including the same.

BACKGROUND

In recent years, in order to reduce cost for driving circuits of a display panel, techniques for directly forming a scan line driving circuit (i.e., gate drivers) on a display panel substrate using a thin film transistor process have been implemented. However, reliable techniques for directly forming a data line driving circuit (i.e., data drivers) on the display panel substrate have not been successfully developed, so manufacturing cost for a display device cannot be further reduced. The main issue resides in that digital-to-analog (DAC) converters and buffers (implemented using operational amplifiers) which are included in the data line driving circuit of a conventional display device are analog circuits. Using thin film transistors (TFTs), whose characteristics are not sufficiently uniform, to implement such analog circuits directly on the display panel substrate may result in high cost.

SUMMARY

Therefore, an object of the disclosure is to provide a data line driving circuit that may resolve the above-mentioned issue.

According to a first aspect of this disclosure, the data line driving circuit for a display device having a plurality of data lines is provided to include a plurality of data line drivers to be respectively coupled to the data lines. Each of said data line drivers includes a register unit, a pulse width modulation (PWM) unit and a charge-discharge unit.

The register unit is to store video data having a pixel value. The PWM unit is coupled to the register unit for receiving the video data therefrom, and generates a PWM signal having a pulse width positively correlated with the pixel value of the video data. The charge-discharge unit is coupled to the PWM unit for receiving the PWM signal therefrom, is to be coupled to a respective one of the data lines, and generates a data voltage on the respective one of the data lines by performing charge-discharge operation on the respective one of the data lines according to the PWM signal. A magnitude of voltage variation on the respective one of the data lines is positively correlated with the pulse width of the PWM signal during the charge-discharge operation.

According to a second aspect of this disclosure, a data line driver to be coupled to a data line of a display device is provided to include a register unit, a pulse width modulation (PWM) unit and a charge-discharge unit.

The register unit is to store video data having a pixel value. The PWM unit is coupled to the register unit for receiving the video data therefrom, and generates a PWM signal having a pulse width positively correlated with the pixel value of the video data. The charge-discharge unit is coupled to the PWM unit for receiving the PWM signal therefrom, is to be coupled to the data line, and generates a data voltage on the data line by performing charge-discharge operation on the data line according to the PWM signal, a magnitude of voltage variation on the data line being positively correlated with the pulse width of the PWM signal during the charge-discharge operation.

According to a second aspect of this disclosure, display device is provided to include a plurality of scan lines, a plurality of data lines, a plurality of pixel units, a scan line driving circuit and a data line driving circuit.

The scan lines are disposed in parallel along a row direction. The data lines are disposed in parallel along a column direction transverse to the row direction, and cooperate with the scan lines to define a pixel array. The pixel units are disposed within the pixel array. The scan line driving circuit is coupled to the scan lines, and drives the scan lines in a scanning manner. The data line driving circuit includes a plurality of data line drivers respectively coupled to said data lines. Each of the data line drivers includes a register unit, a pulse width modulation (PWM) unit and a charge-discharge unit.

The register unit is to store video data having a pixel value. The PWM unit is coupled to the register unit for receiving the video data therefrom, and generates a PWM signal having a pulse width positively correlated with the pixel value of the video data. The charge-discharge unit is coupled to the PWM unit for receiving the PWM signal therefrom, is coupled to a respective one of the data lines, and generates a data voltage on the respective one of the data lines by performing charge-discharge operation on the respective one of said data lines according to the PWM signal, a magnitude of voltage variation on the respective one of said data lines being positively correlated with the pulse width of the PWM signal during the charge-discharge operation.

This disclosure uses digital circuits to replace some conventional analog circuits used in conventional data line driving circuits, so the data line driving circuit thus provided may be directly formed on a non-conducting substrate of a display panel using thin film transistors, thereby reducing cost.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
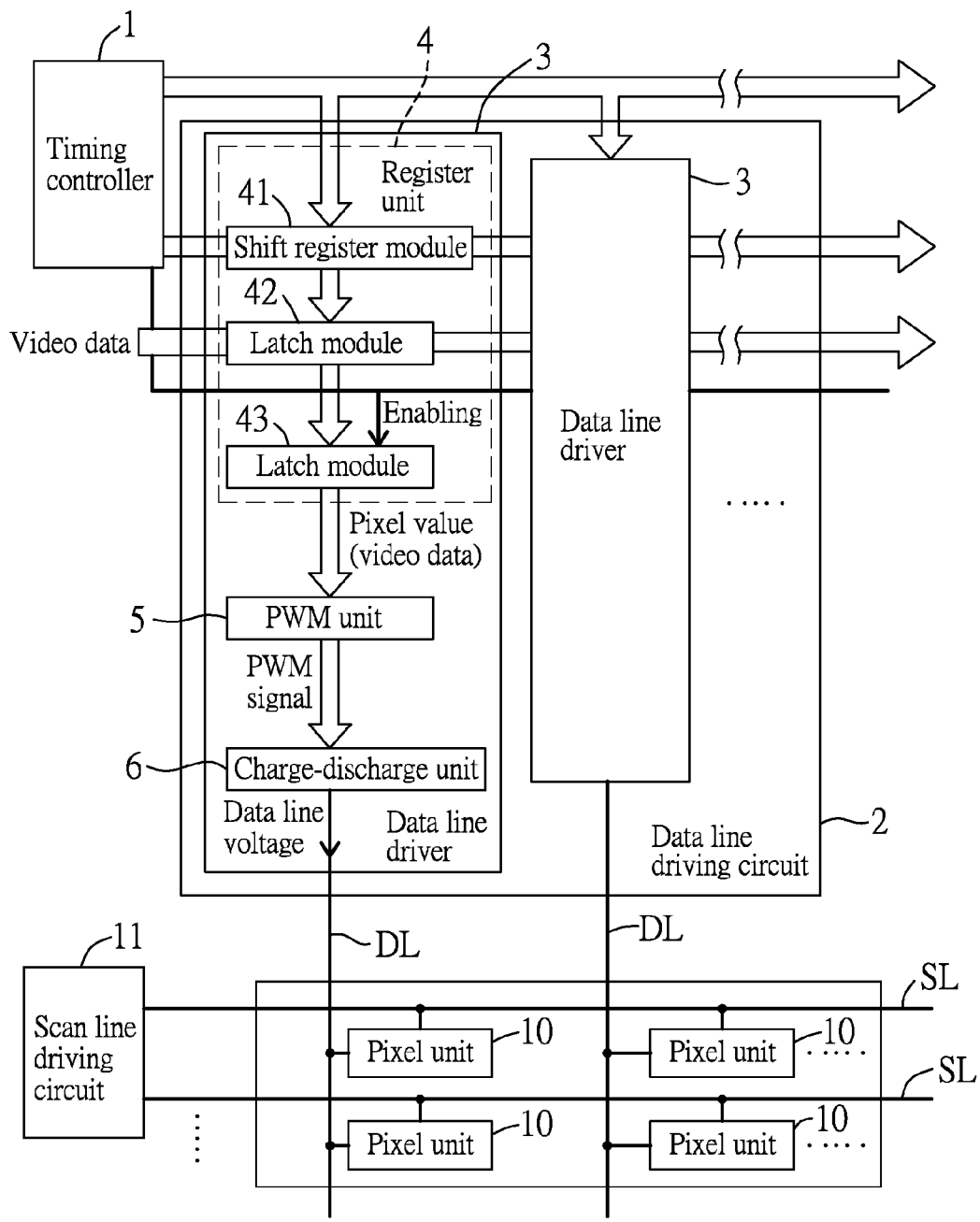
FIG. 1 is a schematic block diagram illustrating a first embodiment of a display device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, the first embodiment of a display device according to this disclosure is shown to include a timing controller 1, a plurality of scan lines (SL), a plurality of data lines (DL), a plurality of pixel units 10, a scan line driving circuit 11 and a data line driving circuit 2.

The scan lines (SL) are disposed parallel to each other along a row direction on a display panel substrate which is a non-conducting substrate made by, for example, glass or plastic. The data lines (DL) are disposed parallel to each other along a column direction transverse to the row direction on the non-conducting substrate, and cooperate with the scan lines (SL) to define a pixel array within which the pixel units 10 are disposed. The scan line driving circuit 11 is coupled to the scan lines (SL), and drives the scan lines (SL) in a scanning manner.

The data line driving circuit 2 includes a plurality of data line drivers 3 respectively coupled to the data lines (DL). Each data line driver 3 includes a register unit 4, a pulse width modulation (PWM) unit 5 and a charge-discharge unit 6.

The register unit 4 stores video data having a pixel value, and includes a shift register module 41 and latch modules 42, 43. The video data may be outputted from the latch module 43 when the latch module 43 is enabled by the timing controller 1.

The PWM unit 5 is coupled to the register unit 4 for receiving the video data therefrom, and generates a PWM signal having a pulse width positively correlated with the pixel value of the video data.

Figure 2:
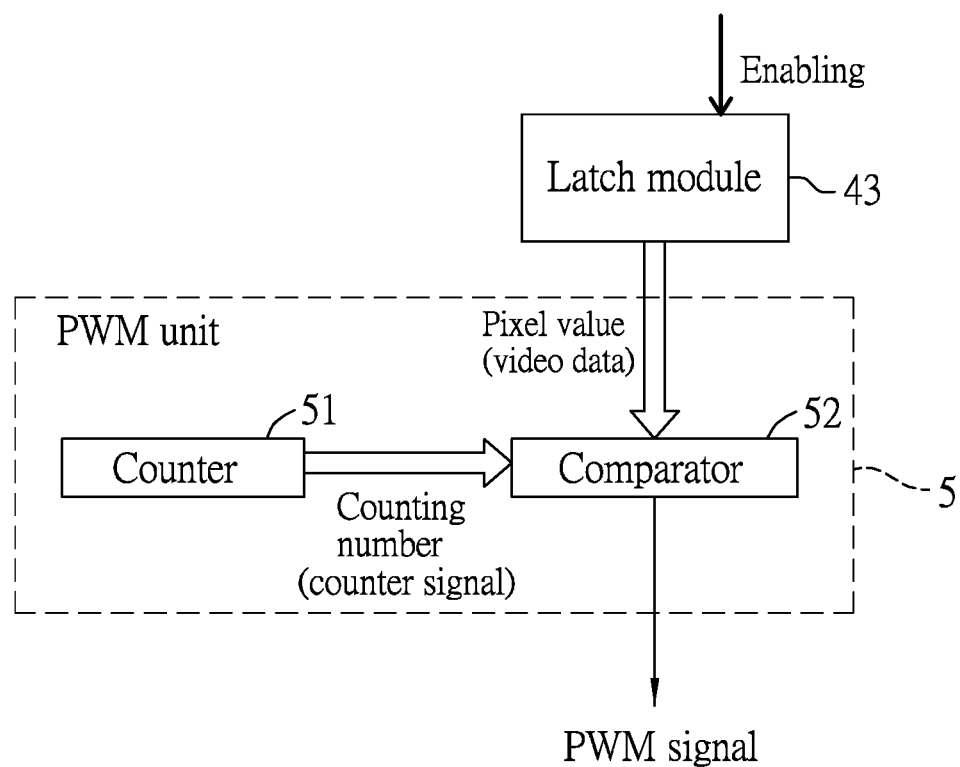
FIG. 2 is a schematic block diagram illustrating a pulse width modulation (PWM) unit of the first embodiment.
Figure 3:
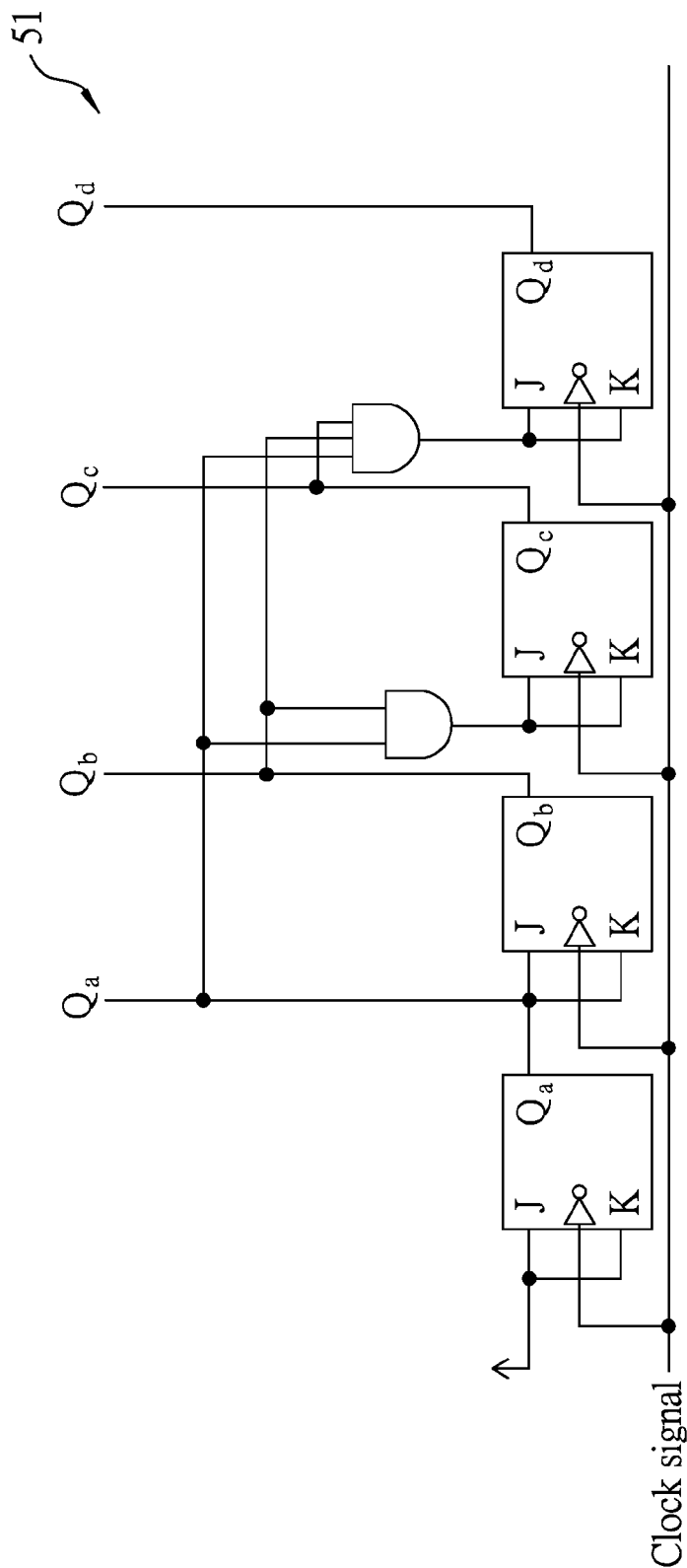
FIG. 3 is a schematic circuit diagram illustrating a 4-bit counter.
Figure 4:
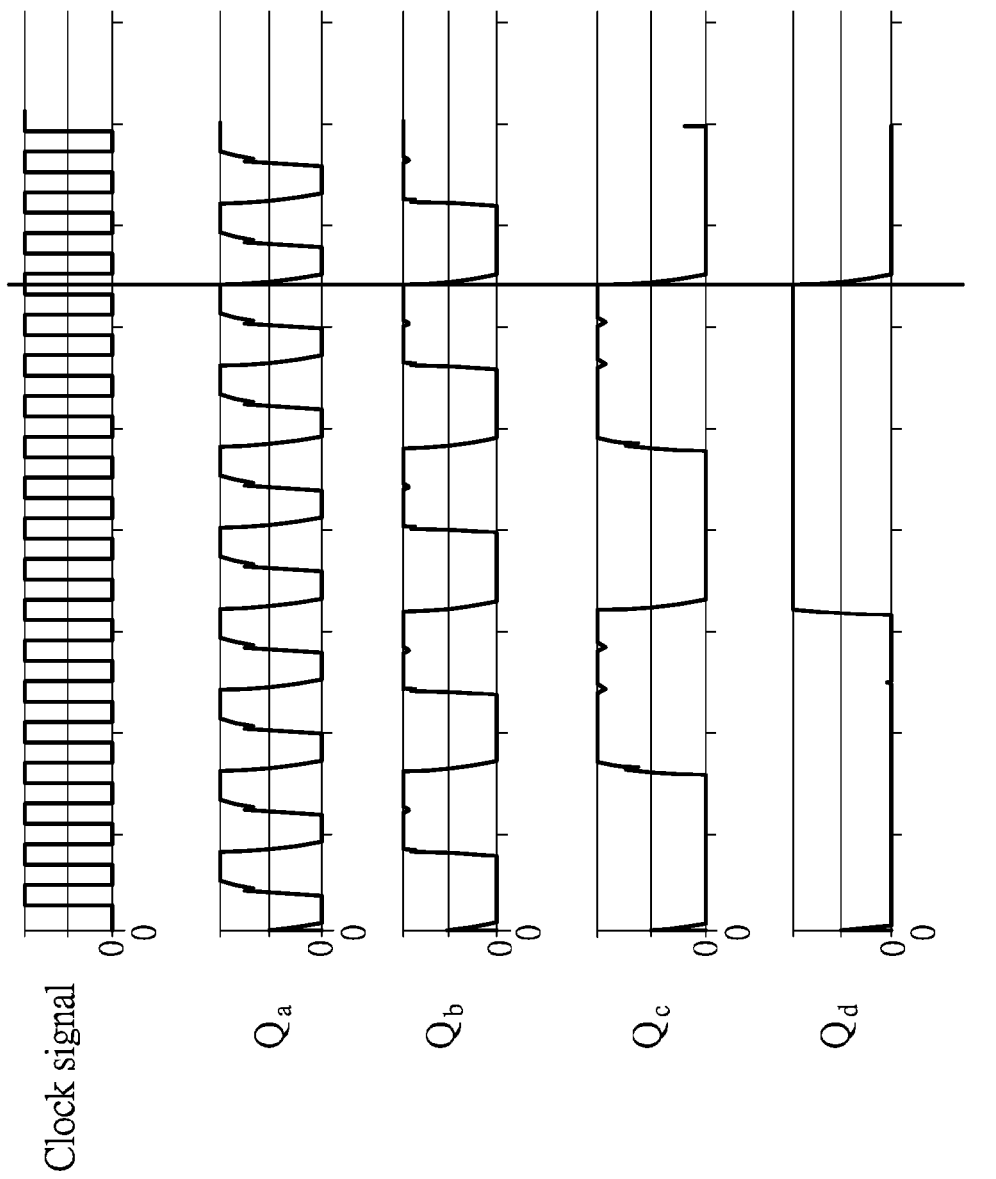
FIG. 4 shows a timing diagram for the 4-bit counter.

Referring to FIG. 2, the PWM unit 5 includes a counter 51 to generate a counter signal that indicates a counting number, and a comparator 52. FIGS. 3 and 4 respectively show a block diagram of a 4-bit counter 51 and an exemplary timing diagram of the same. In this embodiment, the counter 51 includes four JK flip-flops, and the counter signal generated thereby has four bits ($Q_a$, $Q_b$, $Q_c$ and $Q_d$ with $Q_a$ being the least significant bit (LSB) and $Q_d$ being the most significant bit (MSB)) to indicate the counting number ($Q_d Q_c Q_b Q_a$). However, the counter 51 of this disclosure is not limited to the 4-bit counter.

Figure 5:
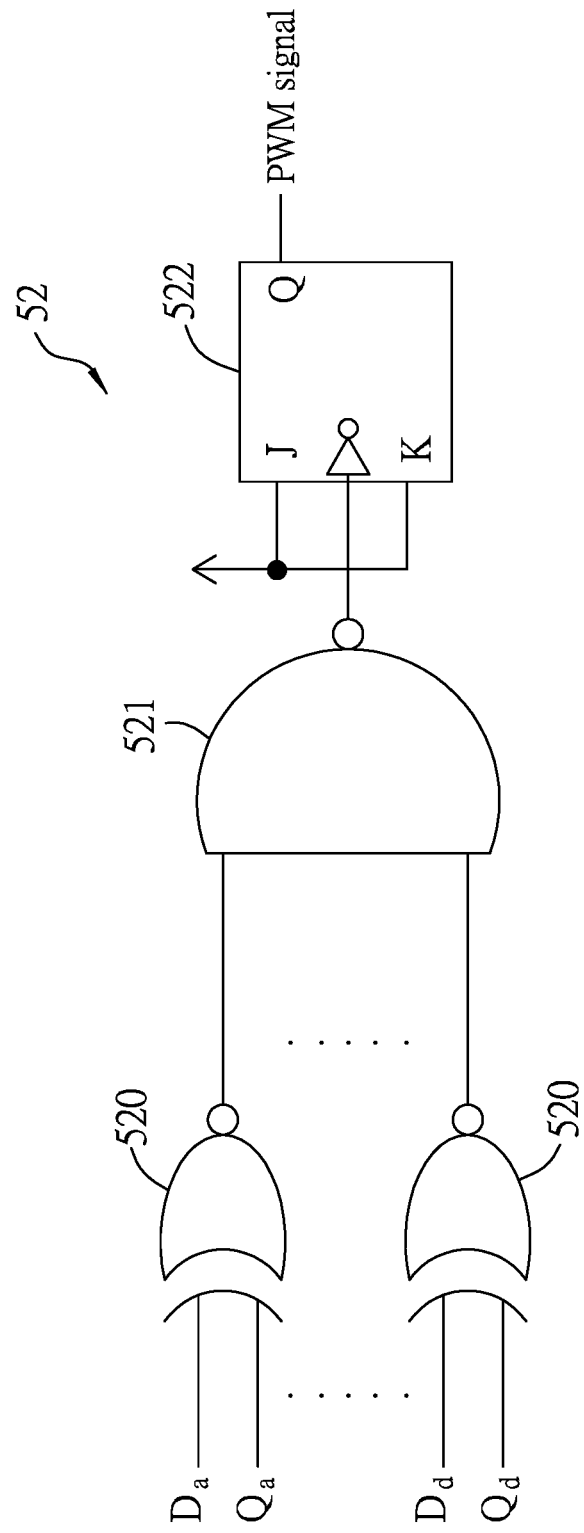
FIG. 5 is a schematic circuit diagram illustrating a comparator of the first embodiment.

Referring back to FIG. 2, the comparator 52 is coupled to the latch module 43 and the counter 51 for respectively receiving the video data and the counter signal therefrom, generates the PWM signal, and determines the pulse width of the PWM signal by comparing the counting number and the pixel value. In one example where the pixel value has four bits "DdDcDbDa" in order from the MSB to the LSB being "0110", an output of the comparator 52 is at a high voltage level when the counter 51 starts counting the counting number ($Q_d Q_c Q_b Q_a$) from "0000" according to a clock signal received thereby, and is transitioned to a low voltage level when the counting number ($Q_d Q_c Q_b Q_a$) becomes "0110", thereby completing generation of the PWM signal. FIG. 5 shows an implementation of the comparator 52 using a logic circuit, which includes a plurality of XNOR gates 520, a NAND gate 521 and a JK flip-flop 522, but the disclosure is not limited thereto.

Figure 6:
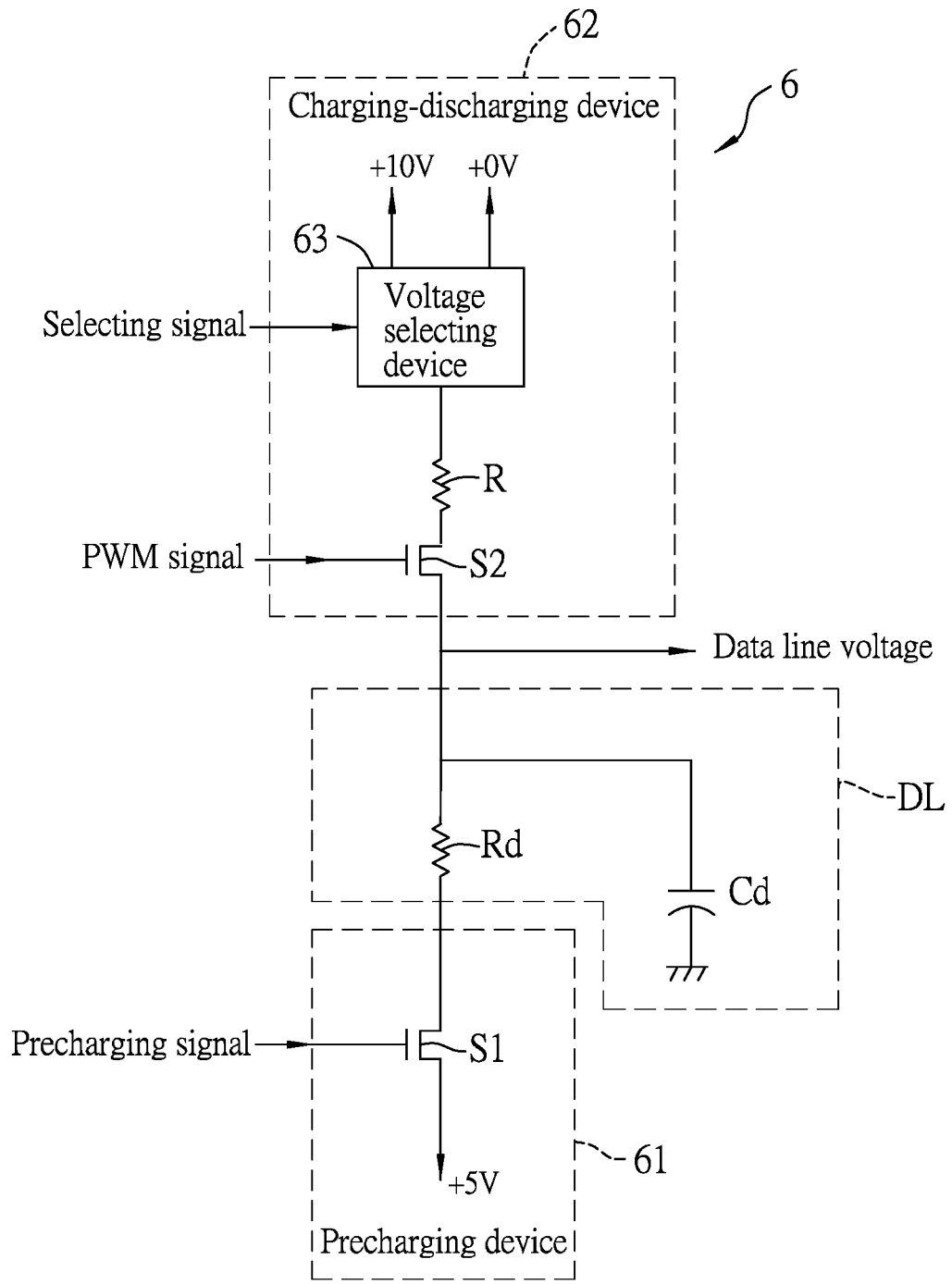
FIG. 6 is a schematic circuit block diagram illustrating a charge-discharge unit of the first embodiment.
Figure 7:
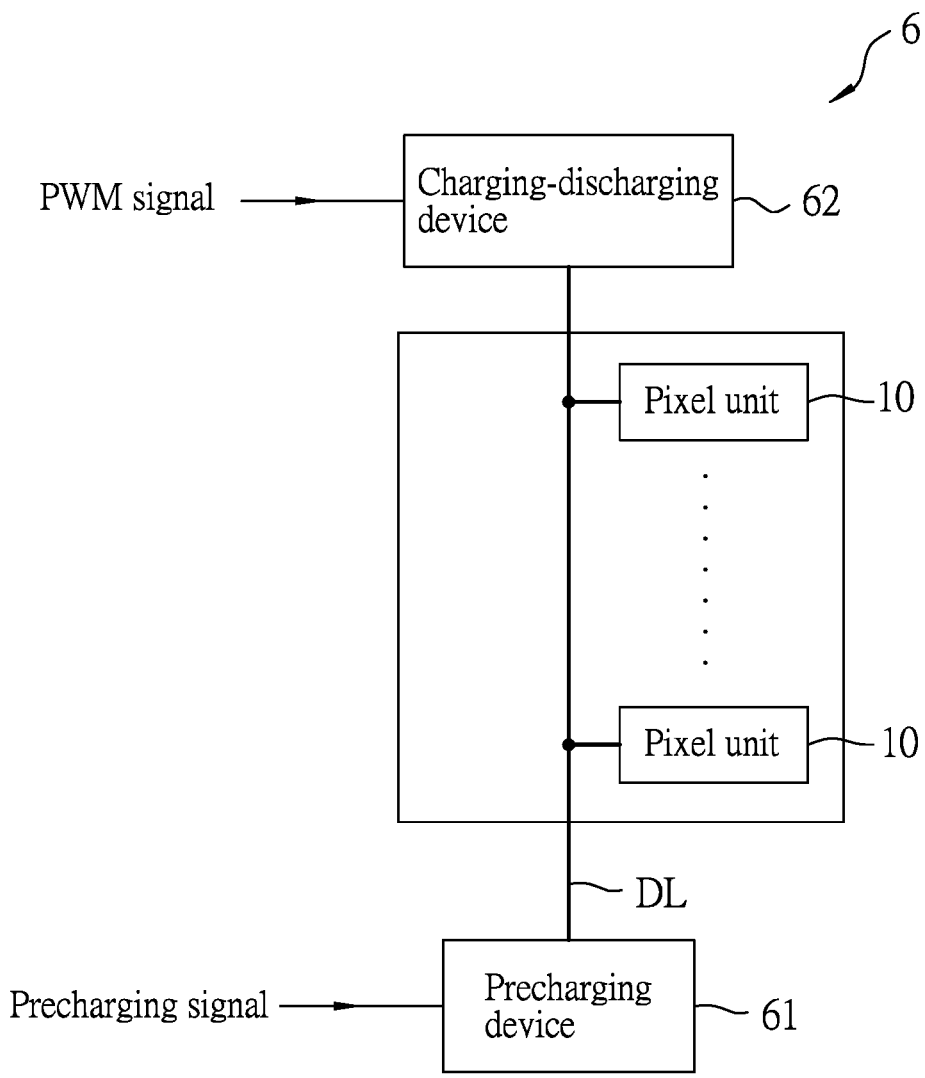
FIG. 7 is a schematic block diagram illustrating a first arrangement for the charge-discharge unit.
Figure 8:
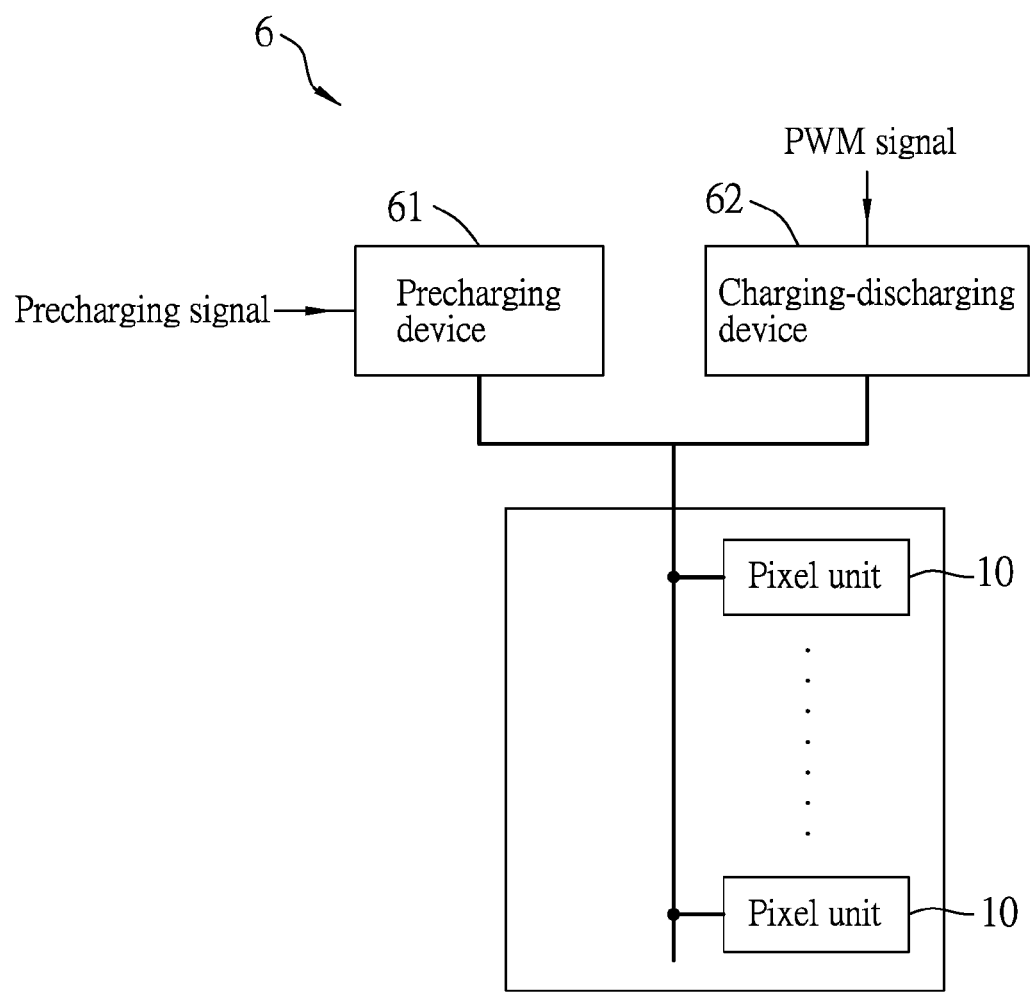
FIG. 8 is a schematic block diagram illustrating a second arrangement for the charge-discharge unit.

Referring back to FIG. 1, the charge-discharge unit 6 is coupled to the PWM unit 5 for receiving the PWM signal therefrom, is coupled to a respective one of the data lines (DL), and generates an analog data voltage on the respective data line (DL) by performing charge-discharge operation on the respective data line (DL) according to the PWM signal. The charge-discharge unit 6 is configured such that a magnitude of voltage variation on the respective data line (DL) is positively correlated with the pulse width of the PWM signal during the charge-discharge operation. Referring to FIG. 6, the charge-discharge unit 6 includes a precharging device 61 and a charging-discharging device 62. FIG. 7 shows a first arrangement for the charge-discharge unit 6, where the precharging device 61 and the charging-discharging device 62 are respectively coupled to two different ends of the respective data line (DL). FIG. 8 shows a second arrangement for the charge-discharge unit 6, where the precharging device 61 and the charging-discharging device 62 are coupled to the same end of the respective data line (DL), and layout area may thus be saved.

Referring to FIG. 6 again, the precharging device 61 is coupled to the respective data line (DL, which is represented as a combination of a parasitic resistor (Rd) and a parasitic capacitor (Cd)), and presets a voltage of the respective data line (DL) (i.e., a data line voltage) to have a reference voltage level. When a display panel of the display device is a liquid crystal display (LCD) panel that uses polarity inversion, the reference voltage level may be an intermediate voltage level between a predetermined high voltage level and a predetermined low voltage level that are respectively used for different polarities, as shown in FIG. 6, where the predetermined high voltage level is 10V, the predetermined low voltage level is 0V, and the reference voltage level is 5V. In FIG. 6, the precharging device 61 includes a first switch (S1) that has a first terminal to receive a reference voltage having the reference voltage level (+5V), a second terminal coupled to the respective data line (DL), and a control terminal receiving a precharging signal to make or break electrical connection between the first and second terminals of the first switch (S1).

The charging-discharging device 62 is coupled to the PWM unit 5 (see FIG. 1) for receiving the PWM signal therefrom, is coupled to the respective data line (DL), and performs the charge-discharge operation on the respective data line (DL), (i.e., on the parasitic capacitor (Cd)) according to the PWM signal after the precharging device 61 presets the data line voltage (i.e., the voltage across the parasitic capacitor (Cd)) to have the reference voltage level (+5V), such that the data line voltage changes (either rises or drops) from the reference voltage level (+5V) by the magnitude of the voltage variation which is positively correlated with the pulse width of the PWM signal. In this embodiment, the charging-discharging device 62 includes a voltage selecting device 63, a second switch (S2) and a resistor device (R). It is noted that the resistor device (R) may be either directly formed on the non-conducting substrate using a thin film process or fabricated within an IC chip using a silicon-wafer semiconductor process, or may even be omitted in some embodiments.

The voltage selecting device 63 receives a first voltage having a first voltage level (+10V), and a second voltage having a second voltage level (+0V) lower than the first voltage level (+10V), has an output terminal, and selectively outputs one of the first and second voltages at the output terminal thereof.

The second switch (S2) has a first terminal, a second terminal, and a control terminal receiving the PWM signal such that the second switch (S2) makes or breaks electrical connection between the first and second terminals thereof according to the PWM signal.

Figure 9:
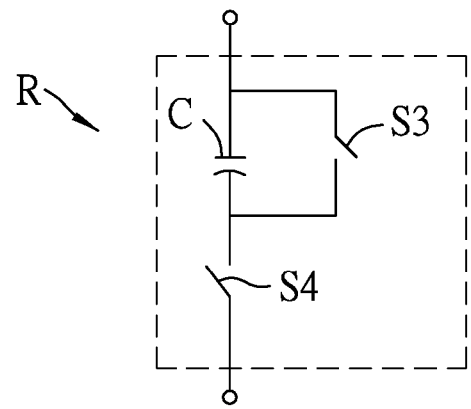
FIG. 9 is a schematic circuit diagram illustrating a resistor device of the first embodiment.

The resistor device (R) is characterized as a resistor, and is coupled to the second switch (S2) in series between the output terminal of the voltage selecting device 63 and the respective data line (DL). Referring to FIG. 9, in this embodiment, the resistor device (R) includes a capacitor (C) and a third switch (S3) coupled in parallel, and a fourth switch (S4). The capacitor (C) and the third switch (S3) has a first common node coupled to the second terminal of the second switch (S2, see FIG. 6), and a second common node. The fourth switch (S4) is coupled between the second common node of the capacitor (C) and the third switch (S3) and the respective data line (DL, see FIG. 6). In this embodiment, conduction/non-conduction of the third switch (S3) is complementary to that of the fourth switch (S4). Since the capacitor (C) and the third and fourth switches (S3, S4) that may be implemented using digital switches are capable of being directly formed on the non-conducting substrate using a thin film process for the display panel, the entire charging-discharging unit 6 that may be implemented with digital-circuit architecture may be directly formed on the non-conducting substrate using the thin film process for the display panel.

Referring to FIG. 6, in one implementation where the display panel is an LCD panel, the precharging device 61 may preset the data line voltage to the reference voltage level (i.e., the intermediate voltage level, +5V), and then the charging-discharging device 62 may charge the parasitic capacitor (Cd) such that the data line voltage rises from the intermediate voltage level (+5V) toward the predetermined high voltage level (+10V), and reaches a desired data voltage during one frame period. During the next frame period, the precharging device 61 may preset the data line voltage to 5V again, and then the charging-discharging device 62 may discharge the parasitic capacitor (Cd) such that the data line voltage drops from the intermediate voltage level (+5V) toward the predetermined low voltage level (+0V), and reaches a desired data voltage, thereby complementing a cycle of polarity inversion. However, in one implementation where the display panel is, for example, an organic light emitting diode (OLED) panel for which polarity inversion is not required, the reference voltage level may be set as the predetermined low voltage level, and the charging-discharging device 62 may only perform charging operation such that the data line voltage rises from the predetermined low voltage level toward the predetermined high voltage level, or only perform discharging operation such that the data line voltage drops from the predetermined high voltage level toward the predetermined low voltage level, and finally reaches a desired data voltage.

Figure 10:
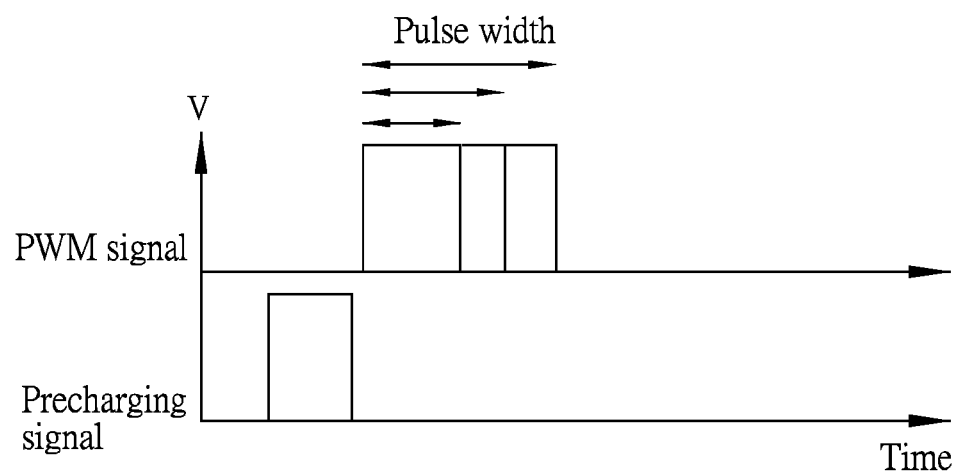
FIG. 10 is a timing diagram illustrating a relationship between a PWM signal and a precharging signal.
Figure 11:
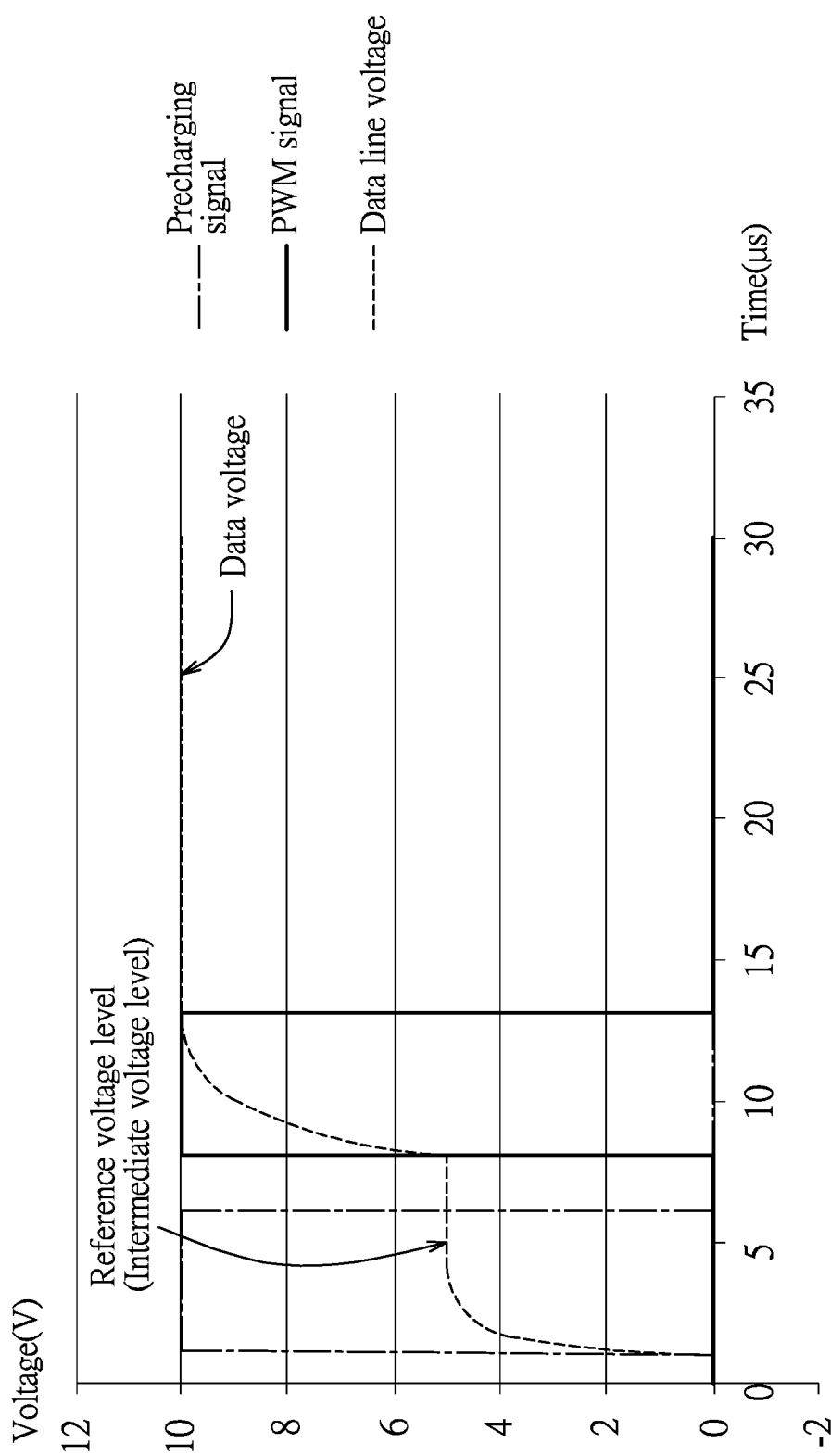
FIG. 11 is a simulation result for charging of a parasitic capacitor of a data line.
Figure 12:
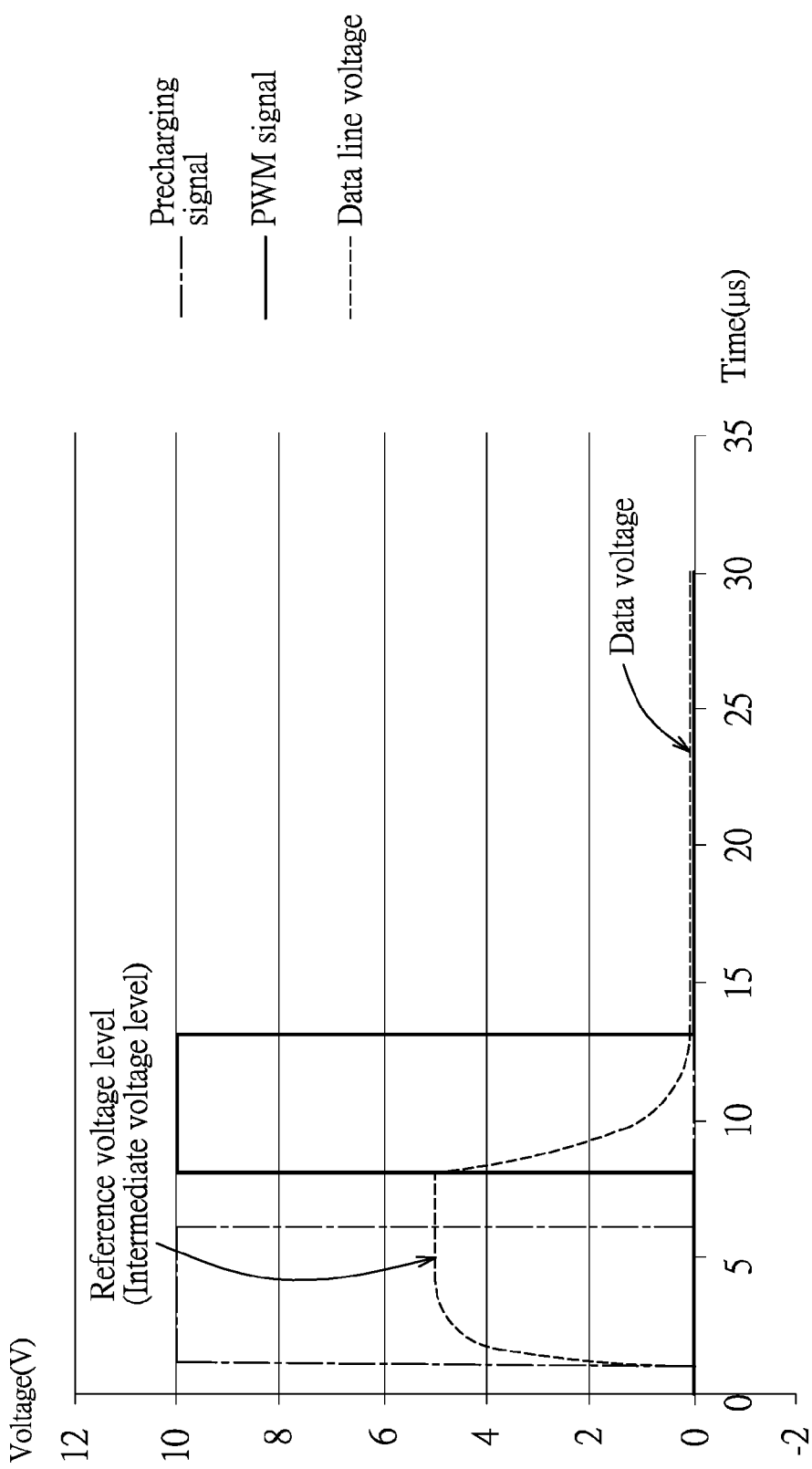
FIG. 12 is a simulation result for discharging of the parasitic capacitor of the data line.
Figure 13:
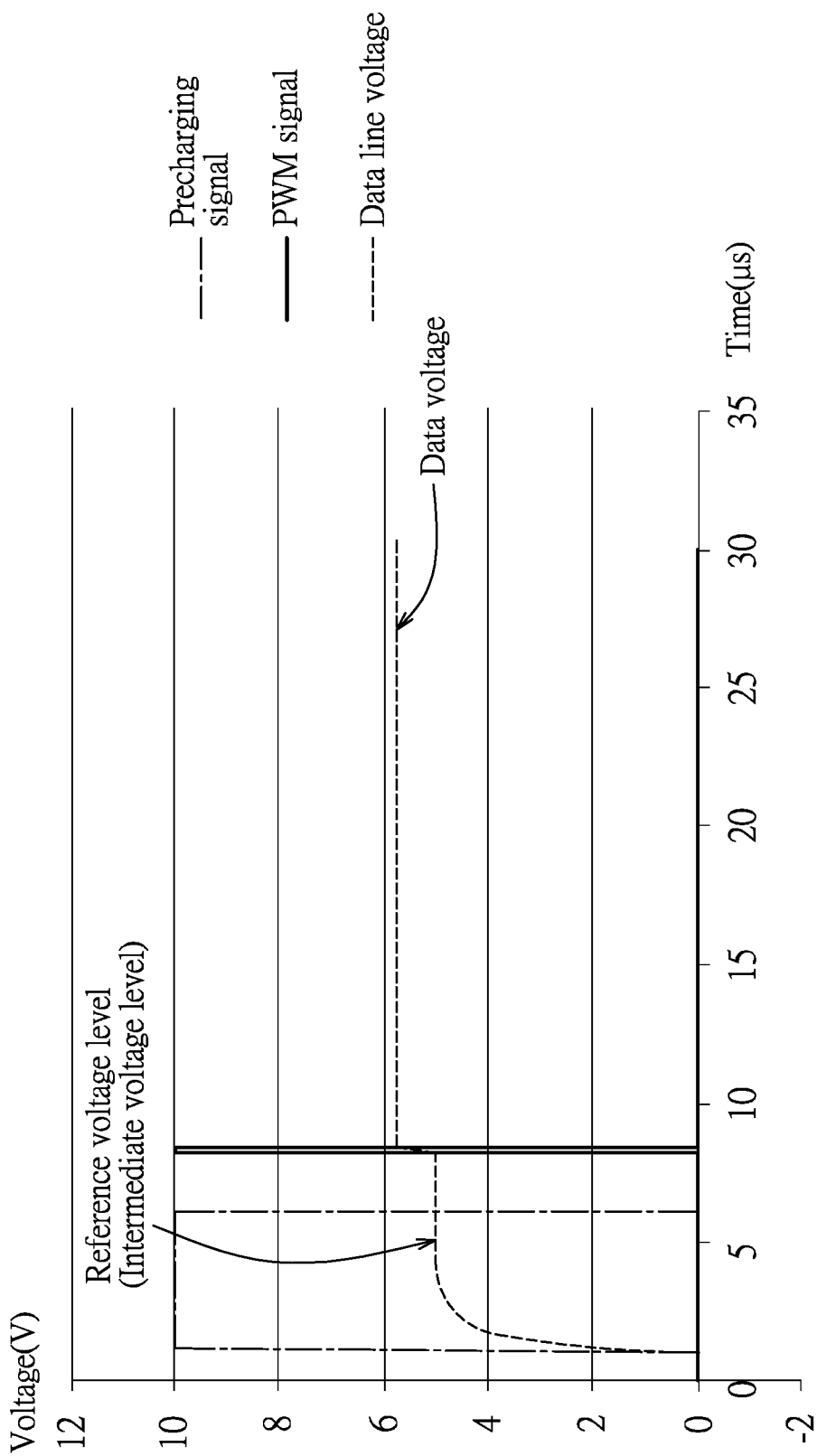
FIG. 13 is a simulation result for charging the parasitic capacitor of the data line.

FIG. 10 shows a timing diagram for the PWM signal and the precharging signal (received by the first switch (S1), see FIG. 6). Referring to FIG. 6 and FIG. 11 that shows a simulation result for charging of the parasitic capacitor (Cd) of the respective data line (DL), when the precharging signal goes high, the first switch (S1) conducts such that the data line voltage is preset to 5V, followed by a selecting signal causing the voltage selecting device 63 to output 10V. Then, when the PWM signal goes high, the second switch (S2) conducts such that the data line voltage is charged from 5V toward 10V, and reaches the desired data voltage. Note that FIG. 11 is exemplified using a maximum pulse width for the PWM signal, during which the data line voltage is charged to 10V, but this disclosure is not limited thereto, and a shorter pulse width may result in lower resultant data line voltage, i.e., lower than 10V. As a result, the charge-discharge unit 6 converts the digital PWM signal into a desired analog data voltage. FIG. 12 shows a simulation result for discharging of the parasitic capacitor (Cd) of the respective data line (DL). Further referring to FIG. 6, when the precharging signal goes high, the first switch (S1) conducts such that the data line voltage is preset to 5V, followed by the selecting signal causing the voltage selecting device 63 to output 0V. Then, when the PWM signal goes high, the second switch (S2) conducts such that the data line voltage is discharged from 5V toward 0V. FIG. 13 shows a simulation result for charging of the parasitic capacitor (Cd) of the respective data line (DL), where the pulse width is 200 ns, i.e., the respective data line (DL) is charged for 200 ns after the data line voltage is preset to 5V and the selecting signal causes the voltage selecting device 63 to output 10V.

Figure 14:
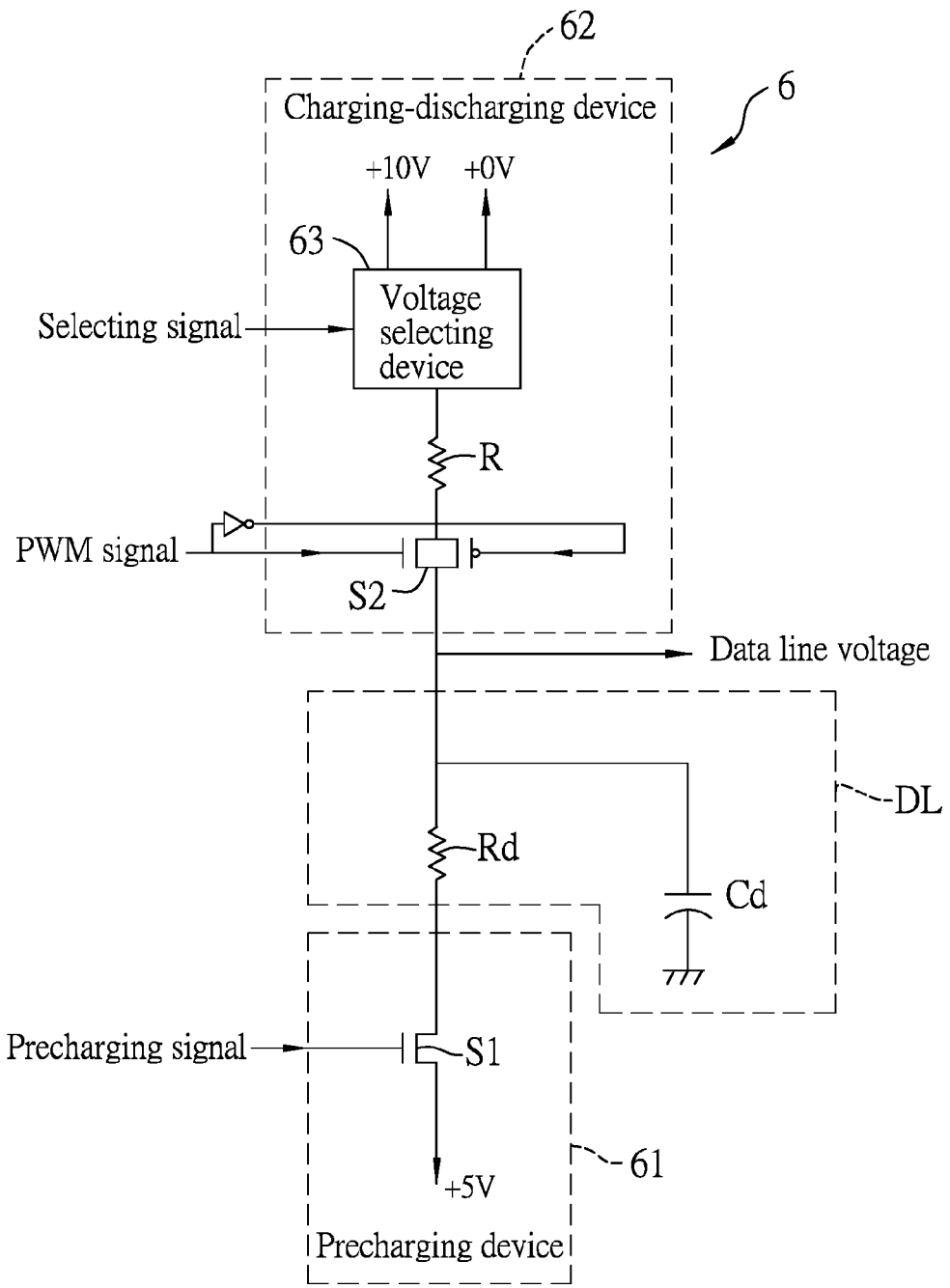
FIG. 14 is a schematic circuit block diagram illustrating a modification of the first embodiment where switches are implemented using complementary transistors.

In this embodiment, each of the first and second switches (S1, S2) is an N-type transistor, but this disclosure is not limited thereto. Referring to FIG. 14, each of the first and second switches (S1, S2) is implemented using complementary transistors. The first switch (S1) is controlled using the precharging signal and a signal complementary to the precharging signal. The second switch (S2) is controlled using the PWM signal and a signal complementary to the PWM signal. Each of the data line drivers 3 (see FIG. 1) is directly formed on the non-conducting substrate using the thin film process for the display panel, but the disclosure is not limited thereto. In one embodiment, for each data line driver 3, the register unit 4 and the PWM unit 5 may be fabricated within an IC chip using a silicon-wafer semiconductor process, and the charge-discharge unit 6 may be directly formed on the non-conducting substrate using the thin film process for the display panel. In one embodiment, for each data line driver 3, the register unit 4 may be fabricated within an IC chip using a silicon-wafer semiconductor process, while the PWM unit 5 and the charge-discharge unit 6 may be directly formed on the non-conducting substrate using the thin film process for the display panel.

Figure 21:
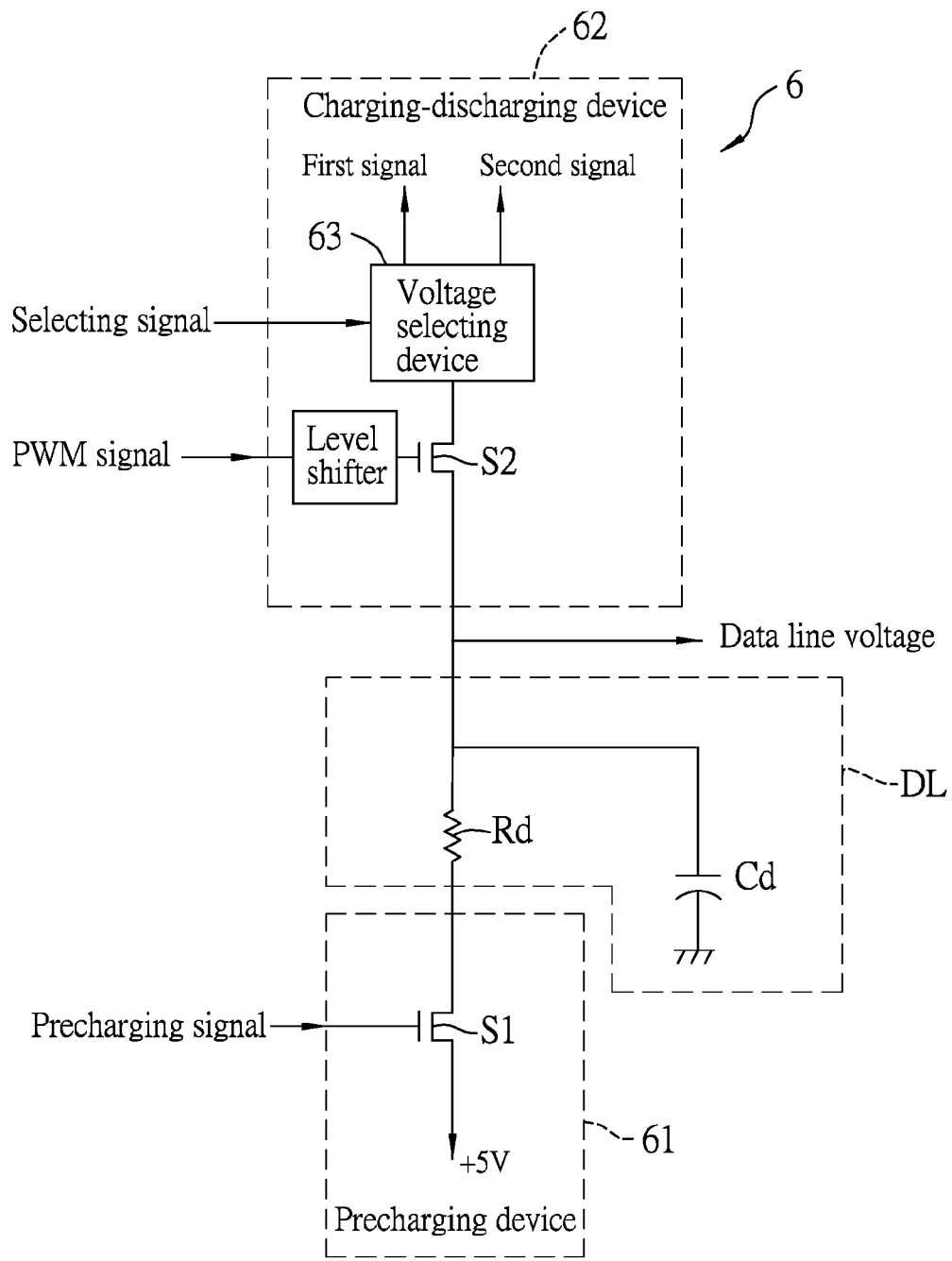
FIG. 21 is a schematic circuit block diagram illustrating a variation of the charge-discharge unit.

Referring to FIG. 21, a variation of the charging-discharging device 62 is shown to include a voltage selecting device 63, a level shifter and a second switch (S2) that is directly formed on the non-conducting substrate. The voltage selecting device 63, which may be formed either in an external IC chip or directly on the non-conducting substrate, receives a first signal having a voltage level varying between the predetermined low voltage level (+0V) and the intermediate voltage level (+5V), and a second voltage having a voltage level varying between the intermediate voltage level (+5V) and the predetermined high voltage level (+10V), has an output terminal, and selectively outputs one of the first and second signals at the output terminal thereof. The level shifter is directly formed on the non-conducting substrate, receives the PWM signal, and converts voltage level of the PWM signal for use by the second switch (S2). The second switch (S2) has a first terminal coupled to the output terminal of the voltage selecting device 63, a second terminal coupled to the respective data line (DL), and a control terminal receiving the PWM signal such that the second switch (S2) makes or breaks electrical connection between the first and second terminals thereof according to the PWM signal. In one implementation, the first signal repeatedly increases from the predetermined low voltage level (+0V) to the intermediate voltage level (+5V), and the second signal repeatedly increases from the intermediate voltage level (+5V) to the predetermined high voltage level (+10V). In one implementation, waveforms of the first and second signals may be generated according to a gamma curve. The first and second signals cooperate with the PWM signal to determine the desired data voltage.

Figure 15:
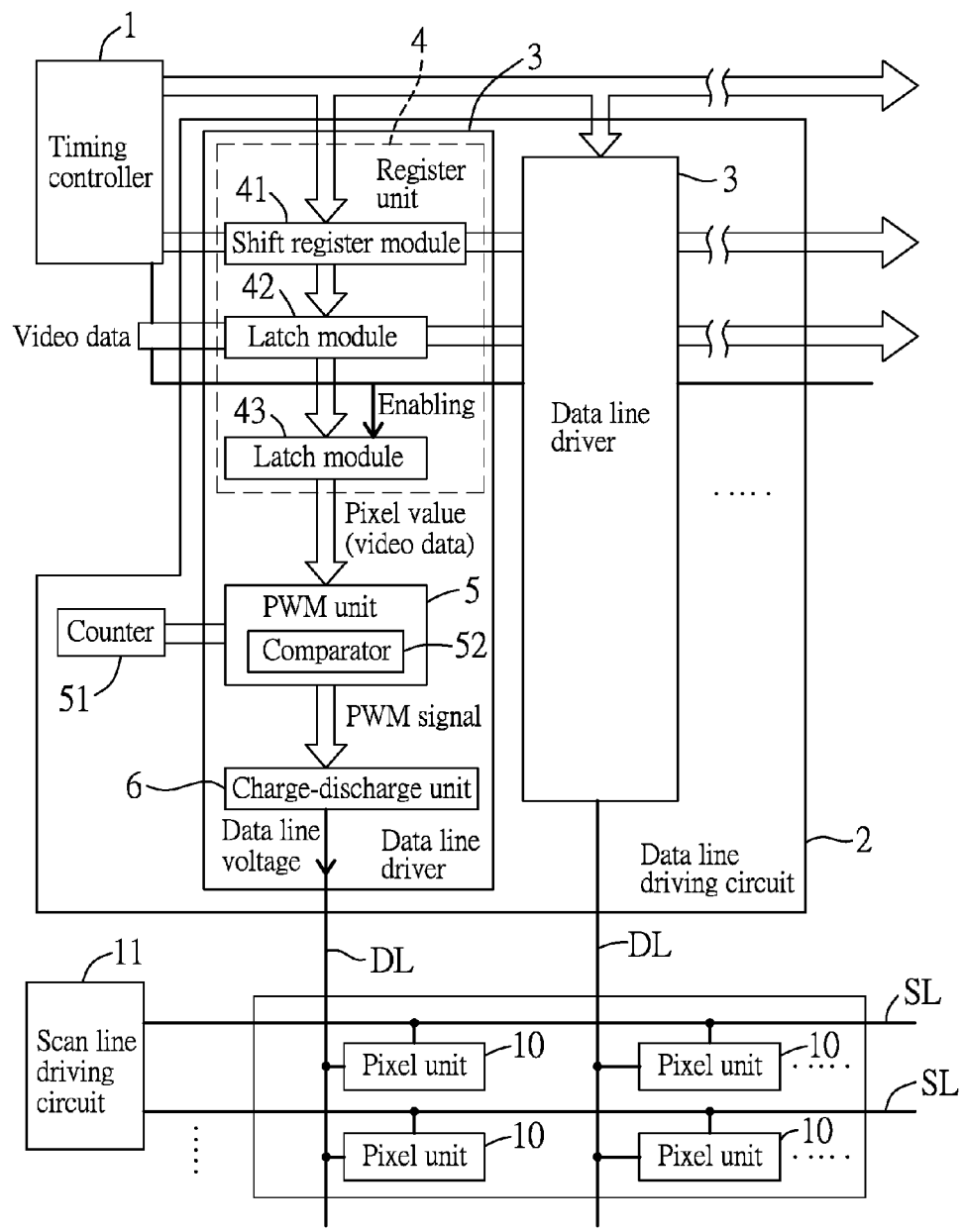
FIG. 15 is a schematic block diagram illustrating a second embodiment of the display device according to the disclosure.

Referring to FIG. 15, the second embodiment of a display device of the disclosure differs from the first embodiment (see FIG. 1) in that: only one counter 51 is used for multiple data line drivers 3 in the second embodiment. In other words, the counter 51 is not included in the PWM unit 5 of each data line driver 3, but is included in the data line driving circuit 2 to generate a counter signal that indicates a counting number for multiple data line drivers 3. The PWM unit 5 of each data line driver 3 includes a comparator 52 coupled to the register unit 4 for receiving the video data therefrom, is coupled to the counter 51 for receiving the counter signal therefrom, generates the PWM signal, and determines the pulse width of the PWM signal by comparing the counting number indicated by the counter signal and the pixel value of the video data.

Figure 16:
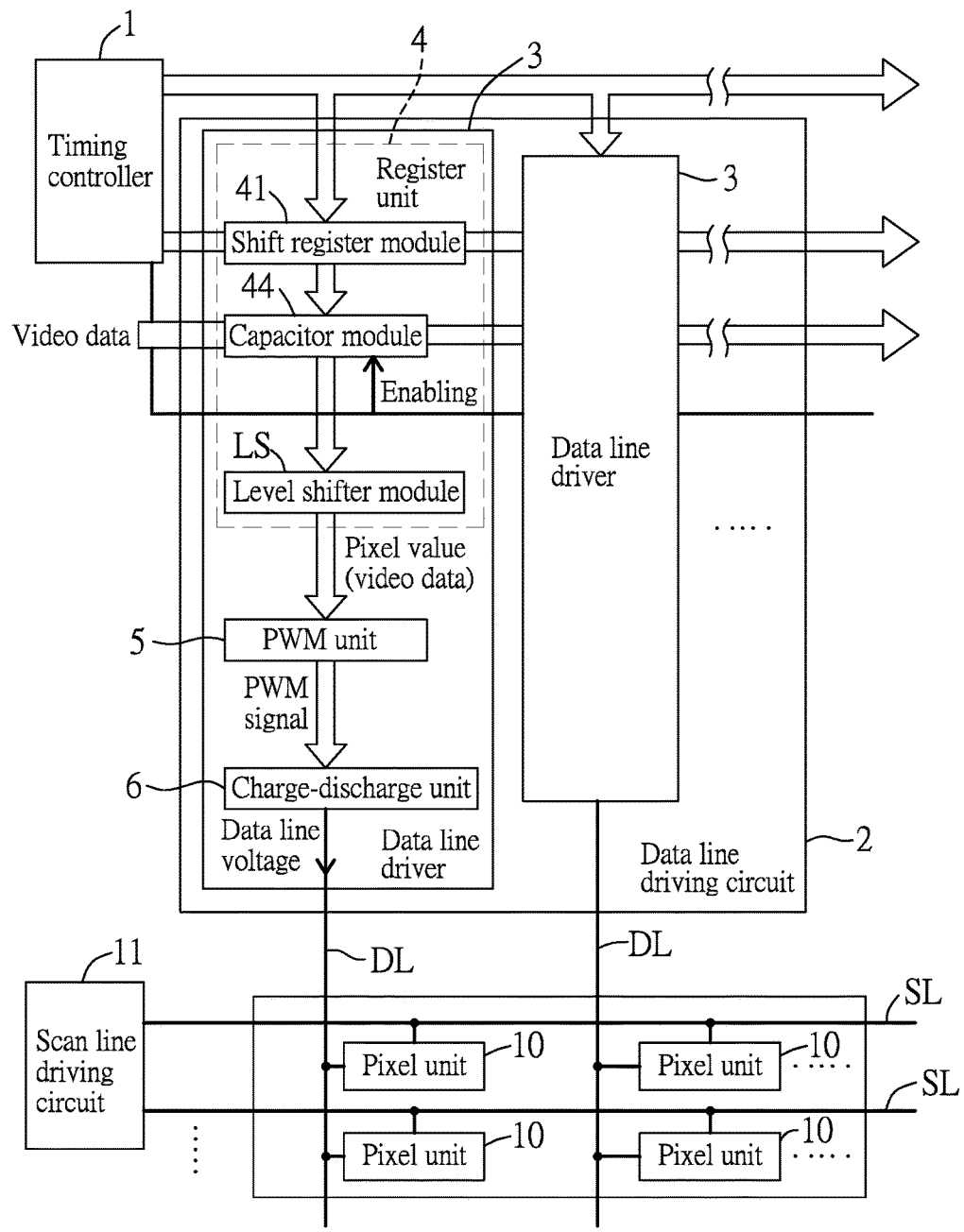
FIG. 16 is a schematic block diagram illustrating a third embodiment of the display device according to the disclosure.

Referring to FIG. 16, the third embodiment of a display device of the disclosure differs from the first embodiment (see FIG. 1) in that: the register unit 4 of each data line driver 3 includes a capacitor module 44 and a level shifter module (LS) in the third embodiment. The capacitor module 44 stores the video data having a set of bits that represent the pixel value, and includes a set of capacitors to respectively store the bits of the video data. The level shifter module (LS) is coupled to the capacitor module 44 for receiving the video data therefrom, and converts voltage level of each of the bits of the video data for use by the PWM unit 5.

Figure 17:
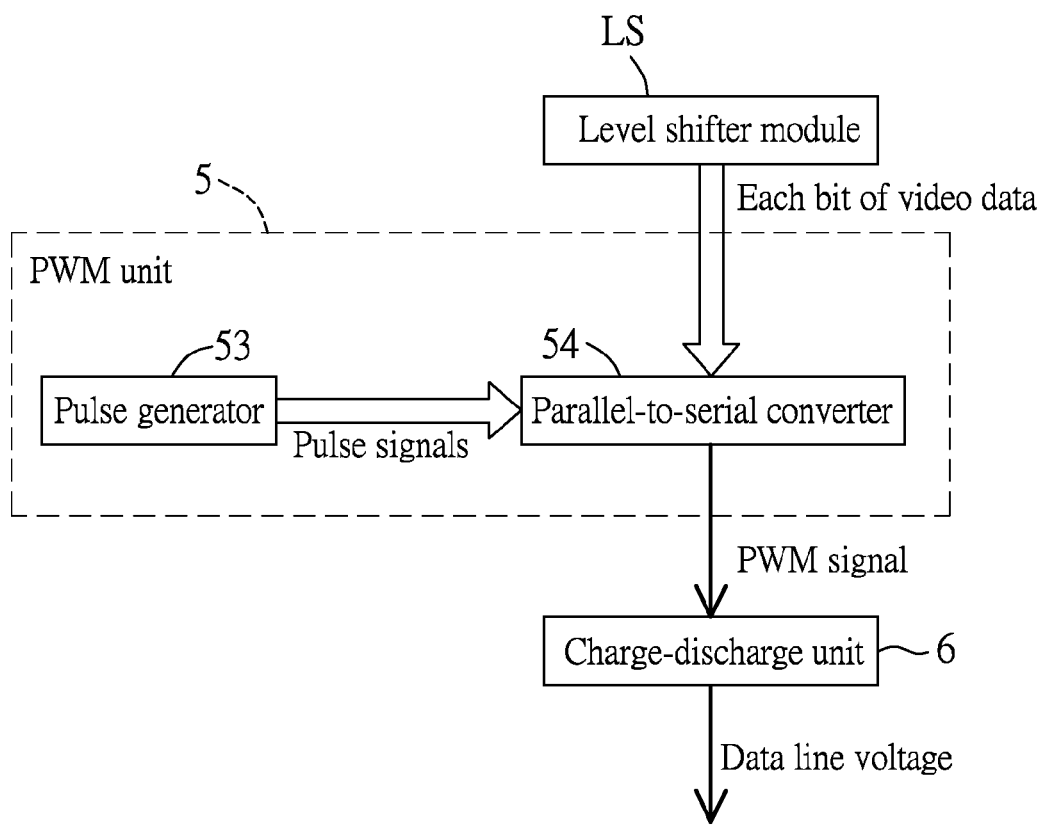
FIG. 17 is a schematic block diagram illustrating a PWM unit of the third embodiment.

Referring to FIG. 17, the PWM unit 5 includes a pulse generator 53 and a parallel-to-serial converter 54. The pulse generator 53 generates a set of pulse signals that have pulse widths different from each other. The pulse widths of the pulse signals in order from the longest one to the shortest one respectively correspond to the bits of the video data in order from the MSB to the LSB. In this embodiment, for each pair of adjacent bits of the set of bits of the video data, the pulse width that corresponds to the more significant bit is twice the pulse width that corresponds to the less significant bit, but this disclosure is not limited thereto. The parallel-to-serial converter 54 is coupled to the pulse generator 53 for receiving therefrom the set of pulse signals, is coupled to the level shifter module (LS) for receiving therefrom each of the bits of the video data that is converted by the level shifter module (LS) in parallel format, and generates the PWM signal by performing AND operation on each of the bits of the video data and a corresponding one of the pulse signals and performing parallel-to-serial conversion.

Figure 18:
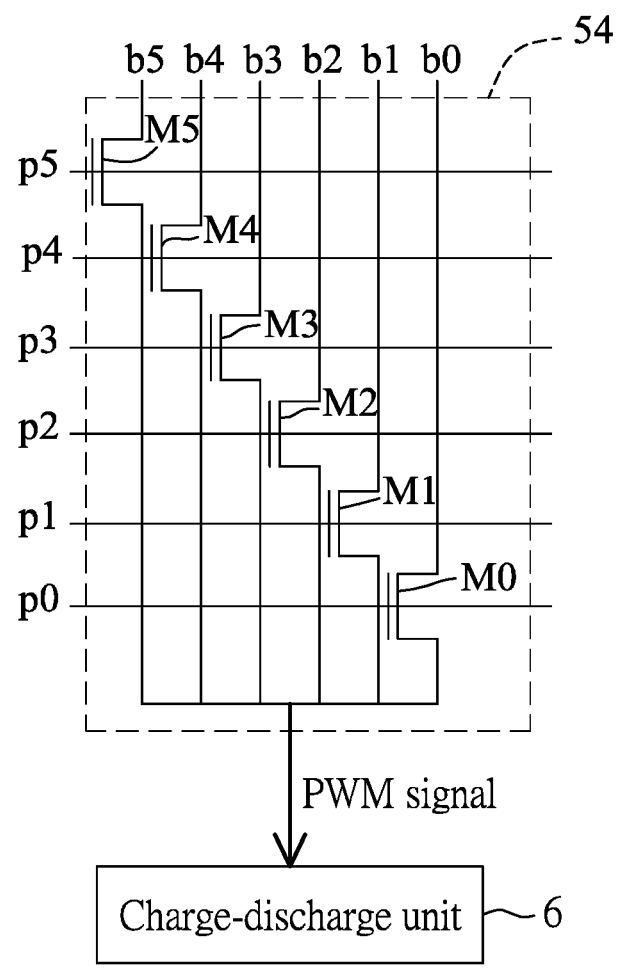
FIG. 18 is a schematic circuit diagram illustrating a parallel-to-serial converter of the third embodiment.

Referring to FIG. 18, the parallel-to-serial converter 54 may include a set of converter switches (M5-M0) that respectively correspond to the bits (b5-b0) of the video data. Each of the converter switches (M5-M0) has a first terminal coupled to the level shifter module (LS, see FIG. 17) for receiving therefrom a respective one of the bits (b5-b0) of the video data, a second terminal, and a control terminal coupled to the pulse generator 53 (see FIG. 17) for receiving one of the pulse signals (p5-p0) that has the pulse width corresponding to the respective one of the bits (b5-b0) of the video data.

The second terminals of the converter switches (M5-M0) are coupled together to output the PWM signal.

Figure 19:
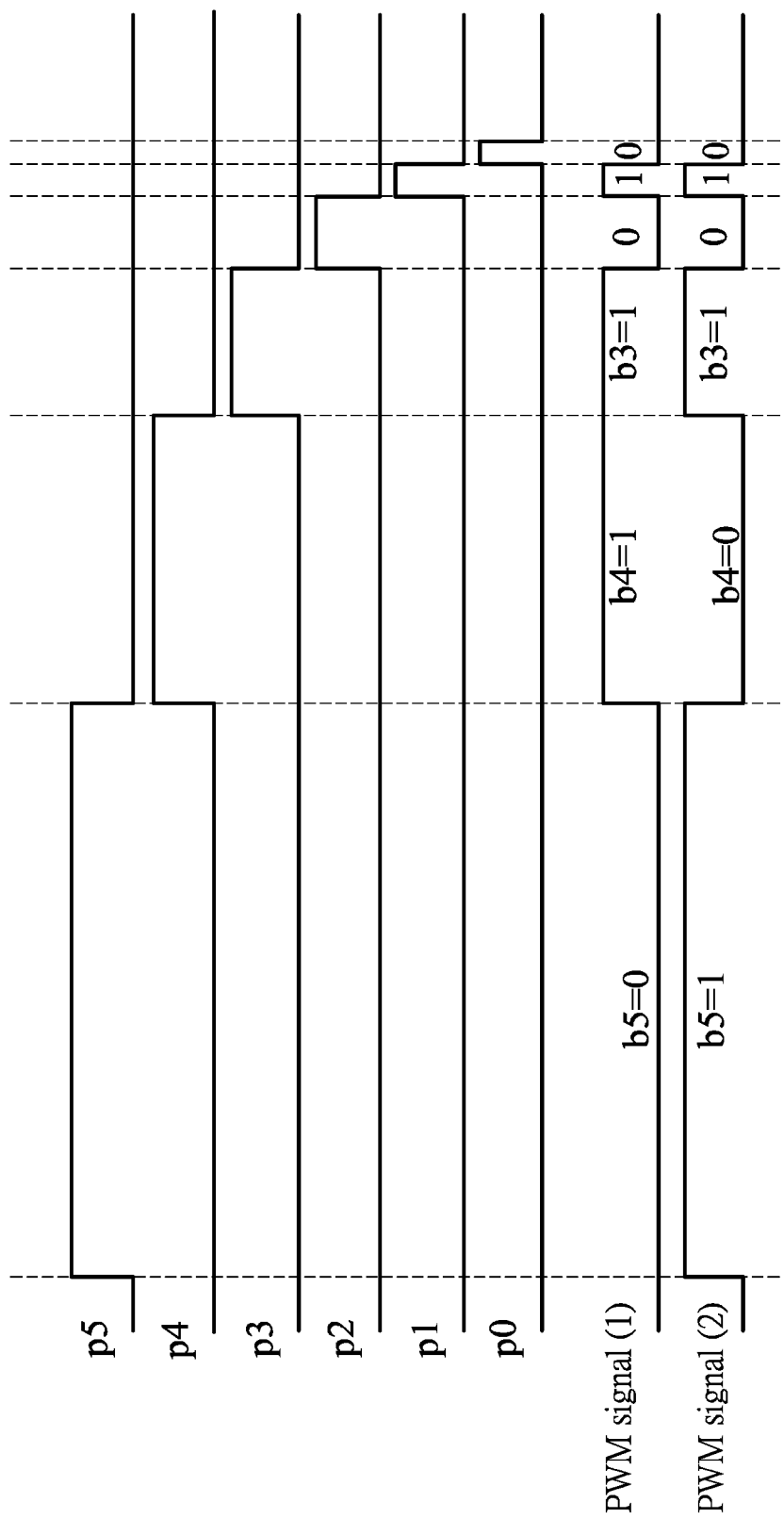
FIG. 19 is a timing diagram illustrating examples of the PWM signal for the third embodiment.

FIG. 19 is a timing diagram illustrating examples of the PWM signal thus generated using the third embodiment when the bits of the video data are respectively "011010" and "101010" in order from the MSB to the LSB. A sum of the pulse widths determines the final data line voltage (i.e., the data voltage).

Figure 20:
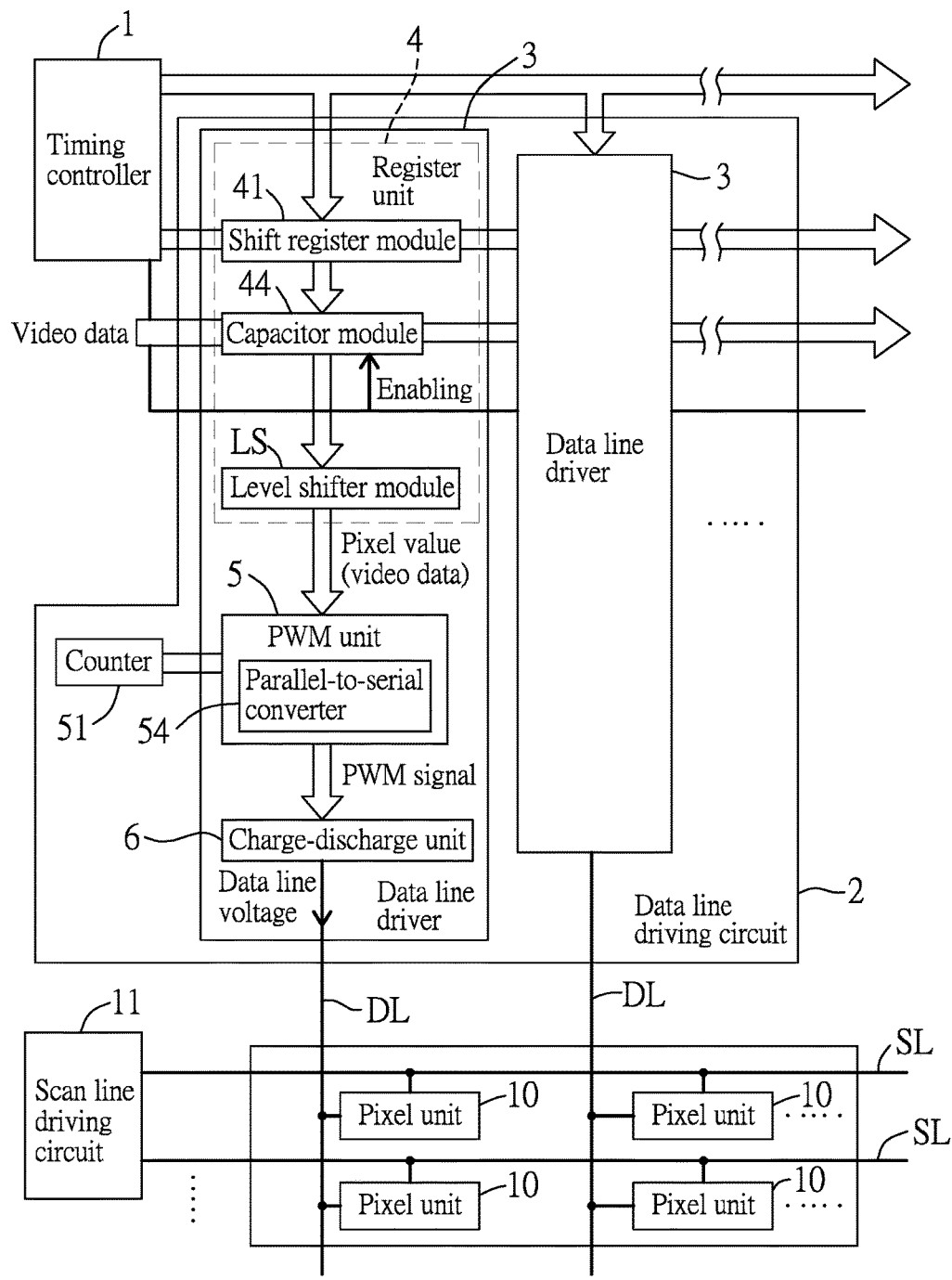
FIG. 20 is a schematic block diagram illustrating a fourth embodiment of the display device according to the disclosure.

Referring to FIG. 20, the fourth embodiment of a display device according to the disclosure differs from the third embodiment (see FIG. 16) in that: in the fourth embodiment, only one pulse generator 53 is used for multiple data line drivers 3. In other words, the pulse generator 53 is not included in the PWM unit 5 of each data line driver 3, but is included in the data line driving circuit 2 to generate a set of pulse signals that have pulse widths different from each other. Similarly, the pulse widths of the pulse signals in order from the longest one to the shortest one respectively correspond to the bits of the video data in order from the MSB to the LSB. The PWM unit 5 includes a parallel-to-serial converter 54 coupled to the pulse generator 53 for receiving therefrom the set of pulse signals, coupled to the level shifter module (LS) for receiving therefrom each of the bits of the video data that is converted by the level shifter module (LS) in parallel format. The parallel-to-serial converter 54 generates the PWM signal by performing AND operation on each of the bits of the video data and a corresponding one of the pulse signals and performing parallel-to-serial conversion.

In summary, the disclosure may have the following advantages:

1. The PWM unit 5 generates the PWM signal with the pulse width(s) corresponding to the video data, so as to control the charge-discharge operation of the charge-discharge unit 6 on the parasitic capacitor (Cd) of the respective data line (DL), thereby reaching the desired analog data voltage. In other words, this disclosure controls input of different desired analog data voltages by adjusting the pulse width(s) of the PWM signal in time domain. In this disclosure, the PWM unit 5 and the charge-discharge unit 6, which belong to digital circuits, may be used to replace conventional digital-to-analog converters that belong to analog circuits, and thus the data line driving circuit 2 may be directly formed on the non-conducting substrate with thin film transistors using thin film process.

2. The capacitor module 44 may be used to replace conventional latches to store digital video data, thereby reducing power consumption and saving chip area.

3. The level shifter module (LS) may be used to amplify voltage levels of the video data stored in the capacitor module 44, thereby achieving lower interface voltages required for external inputs of the video data.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A data line driving circuit for a display device having a plurality of data lines, said data line driving circuit comprising:
    a plurality of data line drivers to be respectively coupled to the data lines, each of said data line drivers including:
        a register unit to store video data having a pixel value;
        a pulse width modulation (PWM) unit coupled to said register unit for receiving the video data therefrom, and generating a PWM signal having a pulse width positively correlated with the pixel value of the video data; and
        a charge-discharge unit coupled to said PWM unit for receiving the PWM signal therefrom, to be coupled to a respective one of the data lines, and generating a data voltage on the respective one of the data lines by performing charge-discharge operation on the respective one of the data lines according to the PWM signal, a magnitude of voltage variation on the respective one of the data lines being positively correlated with the pulse width of the PWM signal during the charge-discharge operation;
    wherein said charge-discharge unit includes:
        a precharging device to be coupled to the respective one of the data lines, and to preset a voltage of the respective one of the data lines to have a reference voltage level, said precharging device including a first switch that has a first terminal to receive a voltage having the reference voltage level, and a second terminal to be coupled to the respective one of the data lines, and that makes or breaks electrical connection between said first and second terminals thereof, and
        a charging-discharging device coupled to said PWM unit for receiving the PWM signal therefrom, to be coupled to the respective one of the data lines, and to perform the charge-discharge operation on the respective one of the data lines according to the PWM signal after said precharging device presets the voltage of the respective one of the data lines to have the reference voltage level, such that the voltage of the respective one of the data lines changes from the reference voltage level by the magnitude of the voltage variation which is positively correlated with the pulse width of the PWM signal,
        said charging-discharging device including:
            a voltage selecting device that is to receive a first voltage having a first voltage level, and a second voltage having a second voltage level lower than the first voltage level, that has an output terminal, and that selectively outputs one of the first and second voltage at said output terminal thereof;
            a second switch that has a first terminal, a second terminal, and a control terminal receiving the PWM signal such that said second switch makes or breaks electrical connection between said first and second terminals thereof according to the PWM signal; and
        a resistor device coupled to said second switch in series to form a series connection that couples said output terminal of said voltage selecting device to the respective one of the data lines.

2. The data line driving circuit of claim 1, wherein said PWM unit includes:
    a counter to generate a counter signal that indicates a counting number; and
    a comparator coupled to said register unit and said counter for respectively receiving the video data and the counter signal therefrom, generating the PWM signal, and determining the pulse width of the PWM signal by comparing the counting number and the pixel value.

3. The data line driving circuit of claim 1, further comprising a counter to generate a counter signal that indicates a counting number, wherein said PWM unit includes a comparator coupled to said register unit and said counter for respectively receiving the video data and the counter signal therefrom, generating the PWM signal, and determining the pulse width of the PWM signal by comparing the counting number and the pixel value.

4. The data line driving circuit of claim 1, wherein said resistor device is coupled between said output terminal of said voltage selecting device and said first terminal of said second switch, and said second terminal of said second switch is coupled to the respective one of the data lines, said second switch being directly formed on a non-conducting substrate using a thin film process for a display panel.

5. The data line driving circuit of claim 4, wherein said charging-discharging device further includes a level shifter directly formed on a non-conducting substrate using a thin film process for a display panel, receiving the PWM signal, and configured to convert voltage level of the PWM signal for use by said second switch.

6. The data line driving circuit of claim 1, wherein said resistor device includes:
    a capacitor and a third switch coupled in parallel to form a parallel connection; and
    a fourth switch coupled to said parallel connection in series, and
    wherein conduction and non-conduction of said third switch are complementary to those of said fourth switch.

7. The data line driving circuit of claim 1, wherein each of said first and second switches is an N-type transistor.

8. The data line driving circuit of claim 1, wherein each of said first and second switches is implemented using complementary transistors, said first switch is controlled using a first pair of complementary signals consisting of the PWM signal and a signal complementary to the PWM signal, and said second switch is controlled using a second pair of complementary signals.

9. A data line driving circuit for a display device having a plurality of data lines, said data line driving circuit comprising:
   a plurality of data line drivers to be respectively coupled to the data lines, each of said data line drivers including:
      a register unit to store video data having a pixel value;
      a pulse width modulation (PWM) unit coupled to said register unit for receiving the video data therefrom, and generating a PWM signal having a pulse width positively correlated with the pixel value of the video data; and
      a charge-discharge unit coupled to said PWM unit for receiving the PWM signal therefrom, to be coupled to a respective one of the data lines, and generating a data voltage on the respective one of the data lines by performing charge-discharge operation on the respective one of the data lines according to the PWM signal, a magnitude of voltage variation on the respective one of the data lines being positively correlated with the pulse width of the PWM signal during the charge-discharge operation;
   wherein, for each of said data line drivers, said register unit and said PWM unit are fabricated using a silicon-wafer semiconductor process, and said charge-discharge unit is directly formed on a non-conducting substrate using a thin film process for a display panel.

10. A data line driving circuit for a display device having a plurality of data lines, said data line driving circuit comprising:
   a plurality of data line drivers to be respectively coupled to the data lines, each of said data line drivers including:
      a register unit to store video data having a pixel value;
      a pulse width modulation (PWM) unit coupled to said register unit for receiving the video data therefrom, and generating a PWM signal having a pulse width positively correlated with the pixel value of the video data; and
      a charge-discharge unit coupled to said PWM unit for receiving the PWM signal therefrom, to be coupled to a respective one of the data lines, and generating a data voltage on the respective one of the data lines by performing charge-discharge operation on the respective one of the data lines according to the PWM signal, a magnitude of voltage variation on the respective one of the data lines being positively correlated with the pulse width of the PWM signal during the charge-discharge operation;
   wherein, for each of said data line drivers, said register unit is fabricated using a silicon-wafer semiconductor process, and said PWM unit and said charge-discharge unit are both directly formed on a non-conducting substrate using a thin film process for a display panel.

* * * * *